US008344390B2

(12) United States Patent
Matsumuro et al.

(10) Patent No.: US 8,344,390 B2
(45) Date of Patent: Jan. 1, 2013

(54) THIN FILM ACTIVE ELEMENT GROUP, THIN FILM ACTIVE ELEMENT ARRAY, ORGANIC LIGHT EMITTING DEVICE, DISPLAY APPARATUS, AND THIN FILM ACTIVE ELEMENT MANUFACTURING METHOD

(75) Inventors: Tomonori Matsumuro, Tsukuba (JP); Kenji Kasahara, Tsukuba (JP); Yukiya Nishioka, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 149 days.

(21) Appl. No.: 12/740,287

(22) PCT Filed: Oct. 29, 2008

(86) PCT No.: PCT/JP2008/069697
§ 371 (c)(1),
(2), (4) Date: Apr. 28, 2010

(87) PCT Pub. No.: WO2009/057665
PCT Pub. Date: May 7, 2009

(65) Prior Publication Data
US 2010/0258803 A1    Oct. 14, 2010

(30) Foreign Application Priority Data
Oct. 31, 2007  (JP) ................................. 2007-283111

(51) Int. Cl.
*H01L 29/786* (2006.01)
(52) U.S. Cl. ....... 257/72; 257/59; 257/40; 257/E29.273; 257/E51.006
(58) Field of Classification Search .................. 257/59, 257/72, 40, E29.273, E51.006
See application file for complete search history.

(56) References Cited

U.S. PATENT DOCUMENTS
2002/0135312 A1*  9/2002  Koyama ..................... 315/169.3
(Continued)

FOREIGN PATENT DOCUMENTS
CN            1638576 A       7/2005
(Continued)

OTHER PUBLICATIONS
Chinese office action dated Jul. 6, 2011 in counterpart Chinese Application No. 200880113516.X.
(Continued)

*Primary Examiner* — Jerome Jackson, Jr.
*Assistant Examiner* — Yu Chen
(74) *Attorney, Agent, or Firm* — Sughrue Mion, PLLC (57) ABSTRACT

The objective is to achieve an organic thin film transistor group that can be manufactured more easily and at a lower cost. Provided is a thin film active element group comprising a drive active element having a semiconductor channel layer formed in a channel region between a source electrode and a drain electrode; and a switch active element having a semiconductor channel layer formed in a channel region between a source electrode and a drain electrode, the switch active element switching the drive active element. The drive active element and the switch active element are formed to be separated from each other in a direction of a channel width such that a straight line associated with the channel region of the drive active element and a straight line associated with the channel region of the switch active element are parallel to each other. The channel region of the drive active element and the channel region of the switch active element may be aligned linearly with each other in the direction of the channel width.

7 Claims, 8 Drawing Sheets

U.S. PATENT DOCUMENTS

| | | |
|---|---|---|
| 2004/0217353 A1 | 11/2004 | Koo et al. |
| 2005/0145855 A1* | 7/2005 | Park .............................. 257/79 |
| 2006/0063298 A1 | 3/2006 | Winters |
| 2006/0121745 A1 | 6/2006 | Fujii |

FOREIGN PATENT DOCUMENTS

| | | |
|---|---|---|
| JP | 2003-007720 A | 1/2003 |
| JP | 2005-182061 A | 7/2005 |
| JP | 2006-133762 A | 5/2006 |
| JP | 2007-150031 A | 6/2007 |
| WO | 2006/117907 A1 | 11/2006 |

OTHER PUBLICATIONS

Chinese Office Action dated Apr. 23, 2012, in counterpart Chinese Application No. 200880113516.X.

European Office Action dated Feb. 28, 2012 in counterpart European Office Action 08845687.

* cited by examiner

THIN FILM ACTIVE ELEMENT GROUP, THIN FILM ACTIVE ELEMENT ARRAY, ORGANIC LIGHT EMITTING DEVICE, DISPLAY APPARATUS, AND THIN FILM ACTIVE ELEMENT MANUFACTURING METHOD

TECHNICAL FIELD

The present invention relates to a thin film active element group, a thin film active element array, an organic light emitting device, a display apparatus, and a thin film active element group manufacturing method. In particular, the present invention relates to a thin film active element group, a thin film active element array, an organic light emitting device, a display apparatus, and a thin film active element group manufacturing method providing a layout enabling easy manufacturing without restricting mobility.

The present patent application claims priority based on Japanese Patent Application No. 2007-283111 filed on Oct. 31, 2007, the contents of which are incorporated herein by reference.

BACKGROUND ART

Japanese Patent Application Publication No. 2007-150031 discloses an organic thin film transistor whose individual semiconductor layers are formed using a printing method such as an ink jet method.

DISCLOSURE OF THE INVENTION

Problems to be Solved by the Invention

A popular method for forming organic material is a printing technique that involves selecting a region to form an organic thin film, such as an ink jet method. Using this ink jet method to select a printing region or the like to form the thin film enables effective use of the material and allows for a lower manufacturing cost, but there is a desire to make the manufacturing more convenient and to decrease the cost even further. Therefore, a thin film active element group is desired having high drive capability and a structure that can be manufactured at a low cost when using a printing technique.

Therefore, it is an object of an aspect of the innovations herein to provide a thin film active element group, a thin film active element array, an organic light emitting device, a display apparatus, and a thin film active element group manufacturing method, which are capable of overcoming the above drawbacks accompanying the related art. The above and other objects can be achieved by combinations described in the independent claims. The dependent claims define further advantageous and exemplary combinations of the innovations herein.

Means for Solving the Problems

According to a first aspect of the present invention, provided is a thin film active element group comprising a drive active element having a semiconductor channel layer formed in a channel region between a source electrode and a drain electrode; and a switch active element having a semiconductor channel layer formed in a channel region between a source electrode and a drain electrode, the switch active element switching the drive active element. The drive active element and the switch active element are formed to be separated from each other in a direction of a channel width such that a straight line associated with the channel region of the drive active element and a straight line associated with the channel region of the switch active element are parallel to each other. The channel region of the drive active element and the channel region of the switch active element may be aligned linearly with each other in the direction of the channel width.

Effect of the Invention

The present invention provides a thin film active element having a structure with high drive capability and a low manufacturing cost when formed by a printing method.

LIST OF THE REFERENCE NUMERALS 101 thin film transistor group
102 substrate
104 gate electrode
106 gate insulating film
108 drain electrode
110 source electrode
112 channel layer
114 insulating film
120 nozzle
151 thin film transistor group
201 organic light emitting device
202 bottom electrode
204 bank
206 light emitting layer
208 top electrode

BEST MODE FOR CARRYING OUT THE INVENTION

Hereinafter, some embodiments of the present invention will be described. The embodiments do not limit the invention according to the claims, and all the combinations of the features described in the embodiments are not necessarily essential to means provided by aspects of the invention. Element groups including thin film transistor elements, thin film diode elements, and the like may serve as examples of the thin film active element group according to the embodiments described below. The semiconductor material may be organic or inorganic. When using an organic semiconductor material, element groups including organic thin film transistor elements, organic thin film diode elements, and the like may serve as examples of the thin film active element group according to the embodiments described below.

Figure 1:
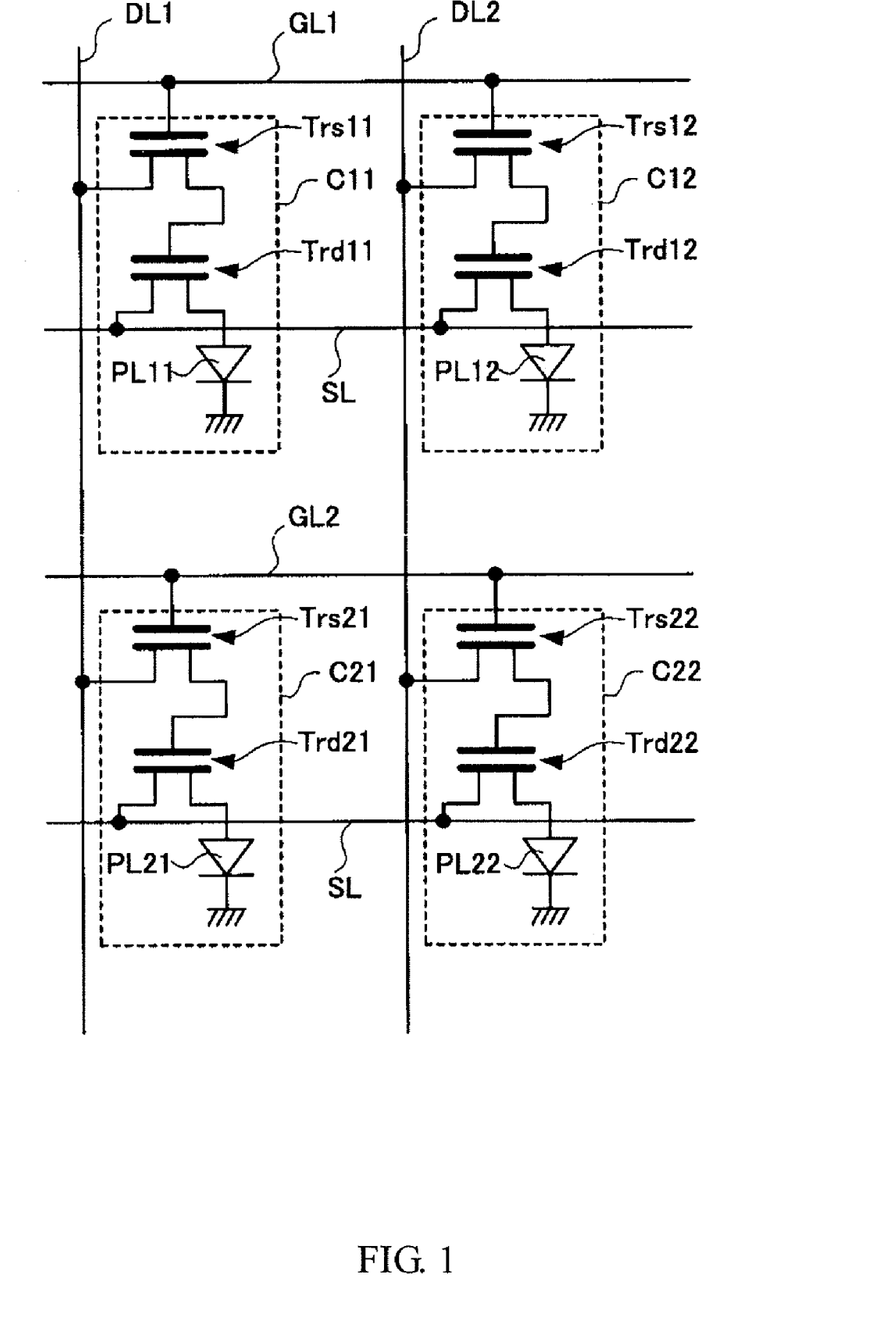
FIG. 1 shows an exemplary circuit of a display apparatus that uses a thin film transistor group 101 according to an embodiment of the present invention.

FIG. 1 shows an exemplary circuit of a display apparatus that uses a thin film transistor group 101 according to an embodiment of the present invention. In FIG. 1, two-digit reference numerals such as "11" and "12" represent the column and row position of the corresponding component in a matrix arrangement. Each of the components in the matrix arrangement is the same, and the reference letter preceding the 2-digit row and column identification number is used to represent a general one of the components. For example, when not referring to a specific one of a light emitting cell C11, a light emitting cell C12, a light emitting cell C21, or a light emitting cell C22, the phrase "light emitting cell C" is used.

The display apparatus shown in FIG. 1 is provided with the light emitting cell C11, the light emitting cell C12, the light emitting cell C21, and the light emitting cell C22. The light emitting cells C are arranged in a matrix of rows and columns. The display apparatus may include a larger number of light emitting cells C. The light emitting cells C in the matrix arrangement are selected by data lines DL and gate lines GL. For example, when data line DL1 and gate line GL1 are selected, the light emitting cell C11 emits light.

Each light emitting cell C includes a switch transistor Trs, a drive transistor Trd, and a light emitting element PL. The gate terminal of the switch transistor Trs is connected to the gate line GL, and the source terminal of the switch transistor Trs is connected to the data line DL. The drain terminal of the switch transistor Trs is connected to the gate terminal of the drive transistor Trd, and the source terminal of the drive transistor Trd is connected to a source line SL. The drain terminal of the drive transistor Trd is connected to the light emitting element PL, and supplies a drive current from the source line SL to the light emitting element PL.

Figure 2:
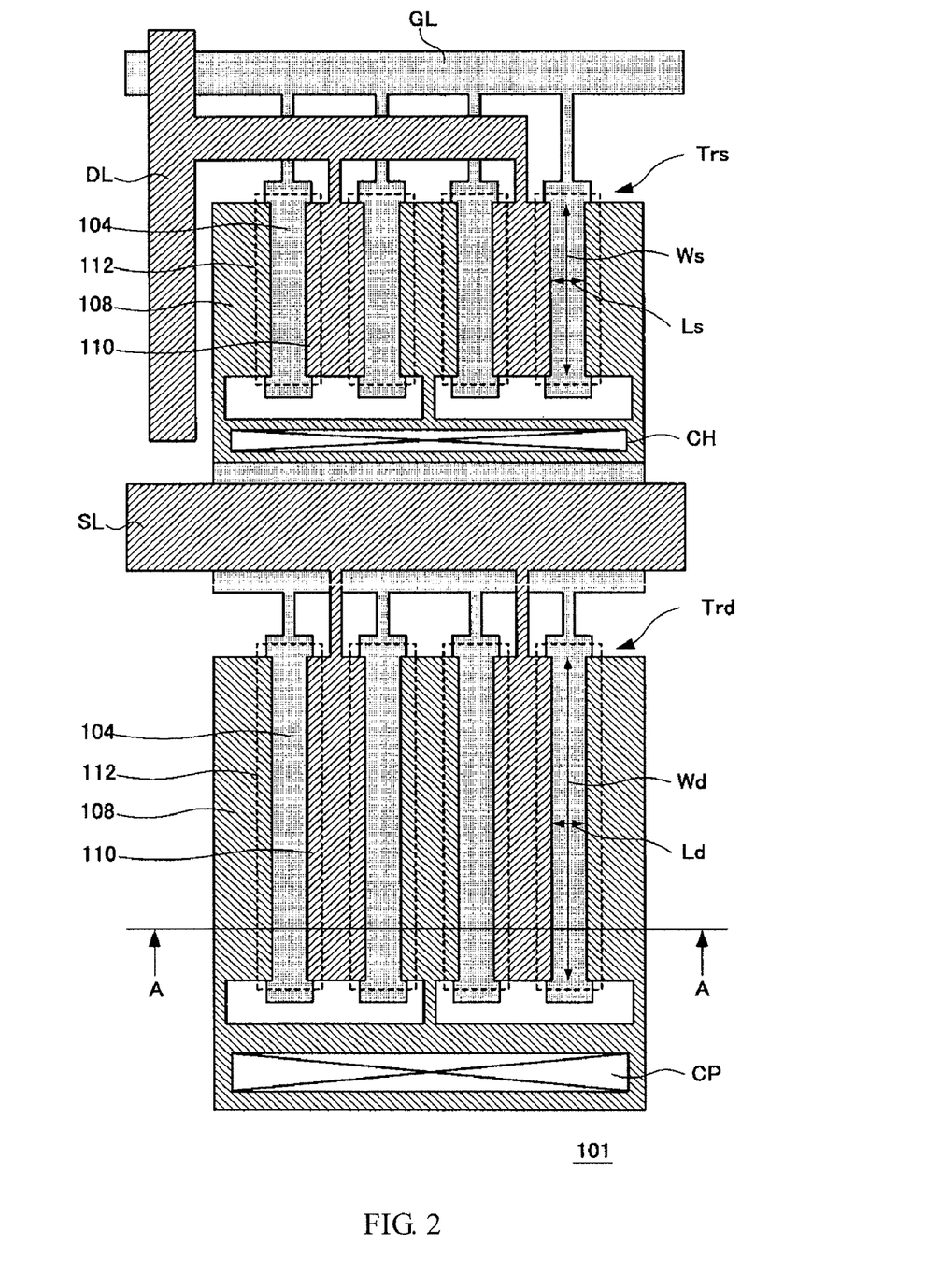
FIG. 2 shows an exemplary top surface of a thin film transistor group 101.

FIG. 2 shows an exemplary top surface of a thin film transistor group 101. Channel layers 112 of the semiconductor are formed in channel regions between source electrodes 110 and drain electrodes 108 of the drive transistor Trd, which is an example of a drive active element. Furthermore, channel layers 112 of the semiconductor are formed in channel regions between the source electrodes 110 and the drain electrodes 108 of the switch transistor Trs, which is an example of a switch active element for switching the drive active element.

The drive transistor Trd and the switch transistor Trs are separated from each other in a direction of a channel width Wd and a channel width Ws, and are formed such that a straight line associated with the channel region of the drive transistor Trd is parallel to a straight line associated with the channel region of the switch transistor Trs. In particular, the channel region of the drive transistor Trd and the channel regions of the switch transistor Trs are aligned linearly in the direction of the channel width Wd and the channel width Ws. Here, referring to the channel regions of the drive transistor Trd and the channel regions of the switch transistor Trs as being "aligned linearly," "in a linear alignment," etc. has the following meaning. This phrase usually means that there is complete overlap between (i) a straight line extending in the direction of the channel width Wd of the drive transistor Trd passing through the center point of a channel length Ld of the drive transistor Trd and (ii) a straight line extending in the direction of the channel width Ws of the switch transistor Trs passing through the center point of a channel length Ls of the switch transistor Trs. This phrase can also mean that these two straight lines do not overlap, but are separated by a distance small enough to be ignored, e.g. a distance of less than 10 µm.

The channel layers of the drive transistor Trd and the switch transistor Trs may be formed of organic material. The organic material may be a polymer organic material. The channel layers made of polymer organic material may be formed on the organic material or the like by a coating technique.

In the thin film transistor group 101 of the present embodiment, the channel regions of the drive transistor Trd and the channel regions of the switch transistor Trs are arranged in parallel and separated in the direction of the channel width, specifically in a linear alignment, and so the channel layers 112 can be formed easily. This arrangement also decreases the manufacturing cost. Specifically, if a coating technique for selectively forming the thin film region, such as nozzle coating or ink jet coating, is used to form the channel layers 112, the channel layers 112 can be formed easily by one-way scanning in the direction of the channel width. If there are a plurality of outlets for injecting ink, which is the channel layer forming material, many channel layers 112 can be formed by a single one-way scan.

Gate electrodes 104 are formed below the channel regions of the switch transistor Trs and the drive transistor Trd, and the drain electrode 108 of the switch transistor Trs is connected to the gate electrode 104 of the drive transistor Trd via a contact hole CH. The drain electrode 108 of the drive transistor Trd is connected to the light emitting element PL by a contact pad CP. The channel length Ld of the drive transistor Trd is usually equal to the channel length Ls of the switch transistor Trs.

The thin film transistor group 101 is provided with a plurality of each of the drive transistor Trd and the switch transistor Trs. Each of the source electrodes 110 and each of the drain electrodes 108 in each drive transistor Trd are connected in parallel. Each of the source electrodes 110 and each of the drain electrodes 108 in each switch transistor Trs are connected in parallel. Each channel region in each drive transistor Trd and each channel region in each switch transistor Trs are aligned linearly and separated from each other in the direction of the channel width Wd and the channel width Ws. An example of another embodiment is a thin film active element group in which the channel length Ld of the drive transistor Trd and the channel length Ls of the switch transistor Trs are different.

Figure 3:
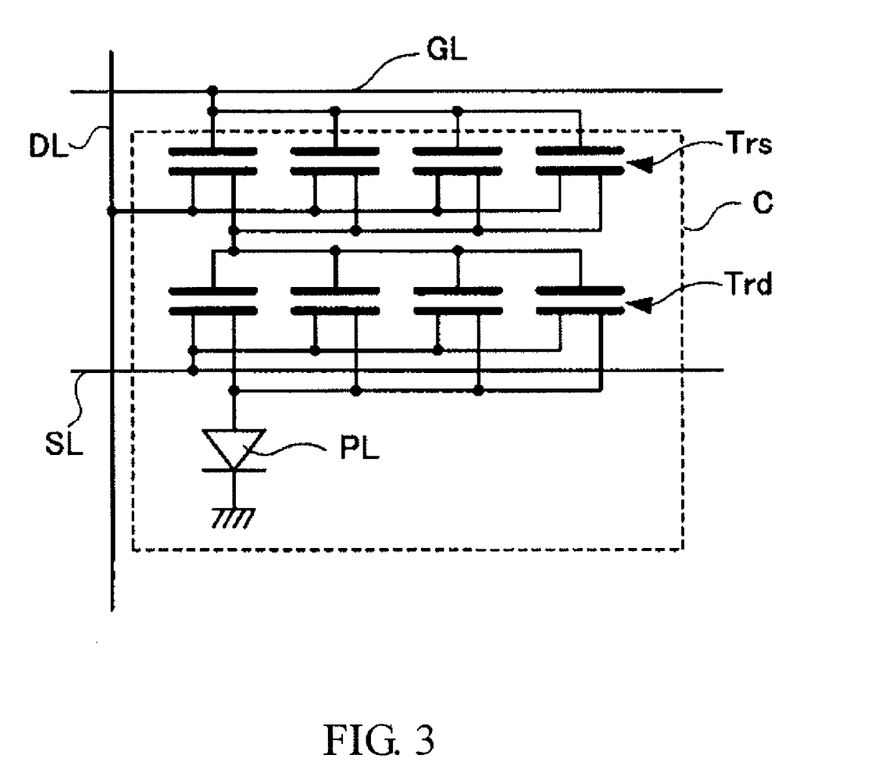
FIG. 3 shows an exemplary circuit of the thin film transistor group 101 together with the light emitting element PL.

FIG. 3 shows an exemplary circuit of the thin film transistor group 101 together with the light emitting element PL. Each light emitting cell C includes four switch transistors Trs and four drive transistors Trd. The four switch transistors Trs are connected to each other in parallel, and the four switch drive transistors Trd are connected to each other in parallel. Since the drive four transistors are connected in parallel, the drive current can be increased by substantially increasing the gate width.

Figure 4:
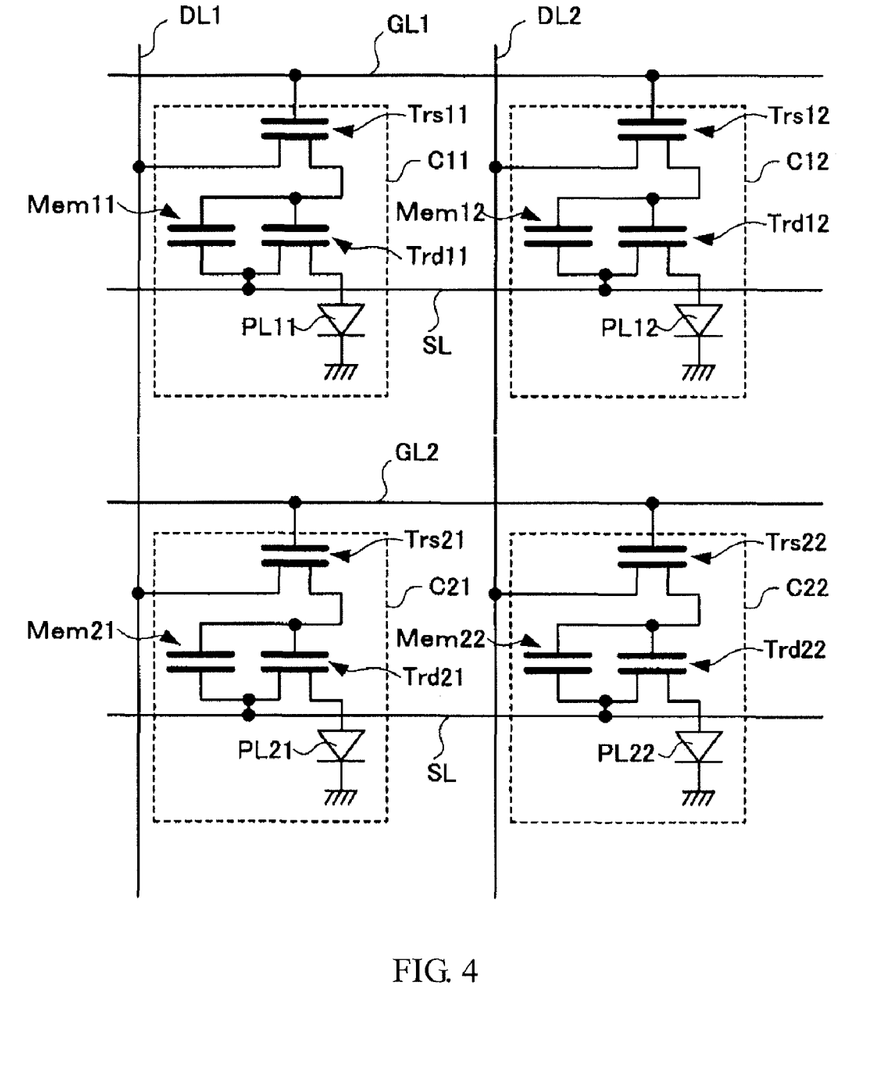
FIG. 4 shows an exemplary circuit of a display apparatus using the thin film transistor group 151 according to another embodiment of the present invention.

FIG. 4 shows an exemplary circuit of a display apparatus using the thin film transistor group 151 according to another embodiment of the present invention. Components that are the same as those shown in FIG. 1 are given the same reference numerals. The display apparatus of FIG. 4 is provided with the light emitting cells C11 etc. in a matrix arrangement of rows and columns, in the same manner as the display apparatus of FIG. 1. Also in the same manner as the display apparatus shown in FIG. 1, the display apparatus of FIG. 4 may include a greater number of light emitting cells C and each light emitting cell C in the matrix arrangement is selected by a data line DL and a gate line GL. However, each light emitting cell C shown in FIG. 4 includes a memory element Mem. If, for example, the data line DL1 and the gate line GL1 are selected or if data is written to the memory element Mem11, the light emitting cell C11 emits light.

Each light emitting cell C includes a switch transistor Trs, a drive transistor Trd, a light emitting element PL, and a memory element Mem. The memory element Mem stores data acquired through the switch transistor Trs, which is an example of a switch active element, and drives the drive transistor Trd, which is an example of a drive active element, according to the data stored after the supply of current through the switch transistor Trs is stopped. The gate terminal of the switch transistor Trs is connected to the gate line GL and the source terminal of the switch transistor Trs is connected to the data line. The drain terminal of the switch transistor Trs is connected to the gate terminal of the drive transistor Trd and to a terminal at one end of the memory element Mem, and the source terminal of the drive transistor Trd is connected to the source line SL and to a terminal at the other end of the memory element Mem. The drain terminal of the drive transistor Trd is connected to the light emitting element PL, and supplies the light emitting element PL with drive current from the source line SL.

Figure 5:
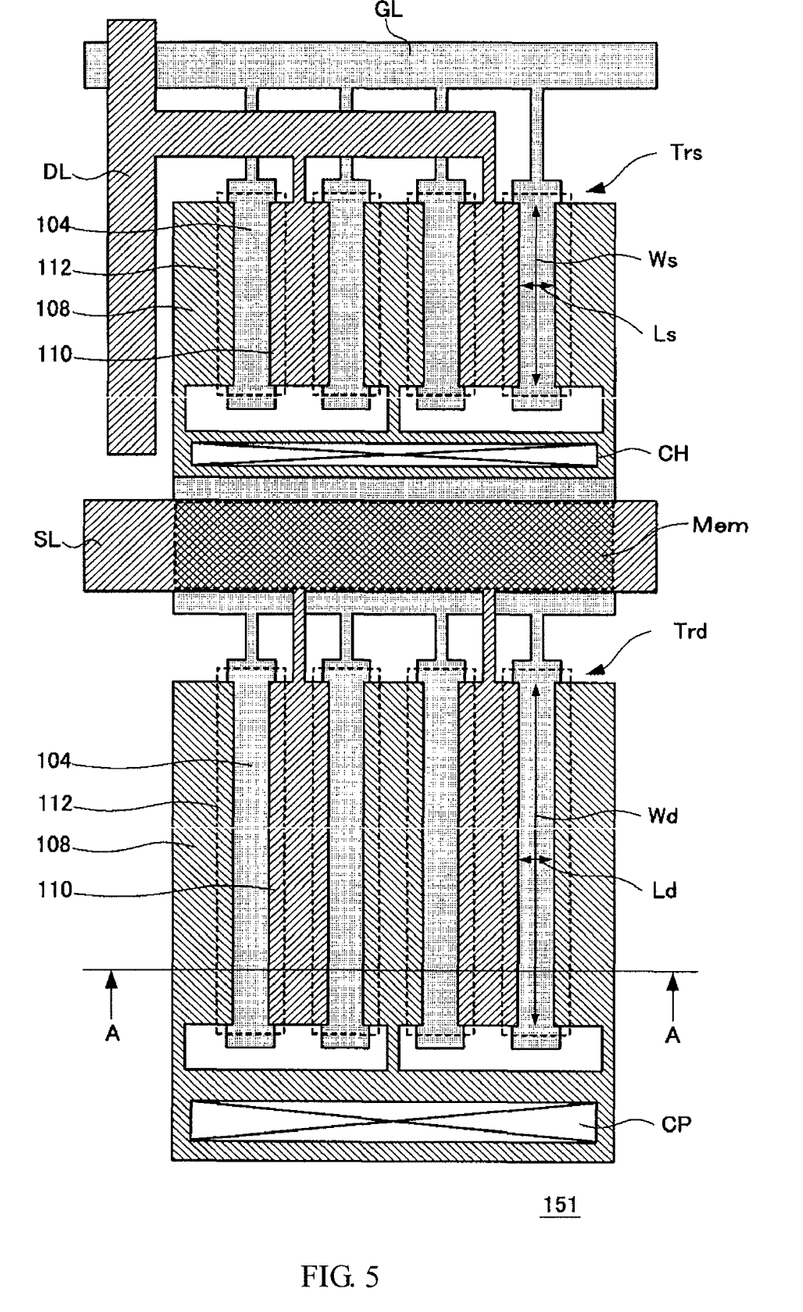
FIG. 5 shows an exemplary top surface of a thin film transistor group 151.

FIG. 5 shows an exemplary top surface of the thin film transistor group 151. Channel layers 112 of the semiconductor are formed in channel regions between source electrodes 110 and drain electrodes 108 of the drive transistor Trd, which is an example of a drive active element. Furthermore, channel layers 112 of the semiconductor are formed in channel regions between the source electrodes 110 and the drain electrodes 108 of the switch transistor Trs, which is an example of a switch active element for switching the drive active element. The channel regions of the drive transistor Trd and the channel regions of the switch transistor Trs are aligned linearly and separated from each other in a direction of a channel width Wd and a channel width Ws.

In the thin film transistor group 151 of the present embodiment, the channel regions of the drive transistor Trd and the channel regions of the switch transistor Trs are arranged in parallel and separated in the direction of the channel width, specifically in a linear alignment, and so the channel layers 112 can be formed easily and the manufacturing cost can be decreased, in the same manner as the thin film transistor group 101. In other words, if a coating technique for selectively forming the thin film region, such as nozzle coating or ink jet coating, is used to form the channel layers 112, the channel layers 112 can be formed easily by one-way scanning in the direction of the channel width. If there are a plurality of outlets for injecting ink, which is the channel layer forming material, many channel layers 112 can be formed by a single one-way scan.

Gate electrodes 104 are formed below the channel regions of the switch transistor Trs and the drive transistor Trd, and the drain electrode 108 of the switch transistor Trs is connected to the gate electrode 104 of the drive transistor Trd via a contact hole CH. The drain electrode 108 of the drive transistor Trd is connected to the light emitting element PL by a contact pad CP. The channel length Ld of the drive transistor Trd is equal to the channel length Ls of the switch transistor Trs. A capacitor is formed between the source line SL and the gate electrode 104 of the drive transistor Trd, and this capacitor functions as a memory element Mem.

The thin film transistor group 151 is provided with a plurality of each of the drive transistor Trd and the switch transistor Trs. Each of the source electrodes 110 and each of the drain electrodes 108 in each drive transistor Trd are connected in parallel. Each of the source electrodes 110 and each of the drain electrodes 108 in each switch transistor Trs are connected in parallel. Each channel region in each drive transistor Trd and each channel region in each switch transistor Trs are aligned linearly and separated from each other in the direction of the channel width Wd and the channel width Ws.

Figure 6:
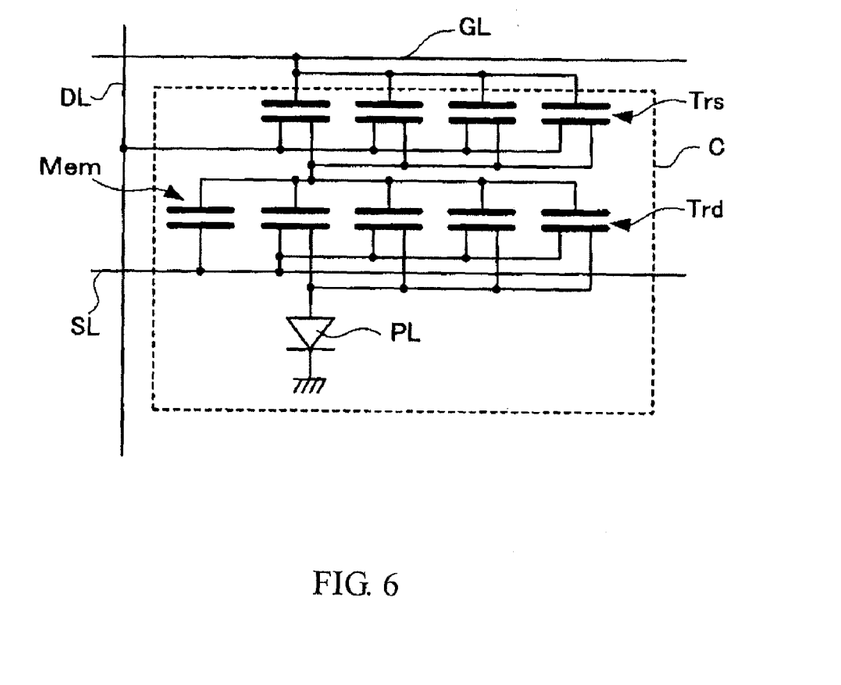
FIG. 6 shows an exemplary circuit of the thin film transistor group 151 together with the light emitting element PL.

FIG. 6 shows an exemplary circuit of the thin film transistor group 151 together with the light emitting element PL. Each light emitting cell C includes four switch transistors Trs, four drive transistors Trd, and one memory element Mem. The four switch transistors Trs are connected to each other in parallel, and the four switch drive transistors Trd are connected to each other in parallel. Since the four drive transistors are connected in parallel, the drive current can be increased by substantially increasing the gate width.

Figure 7:
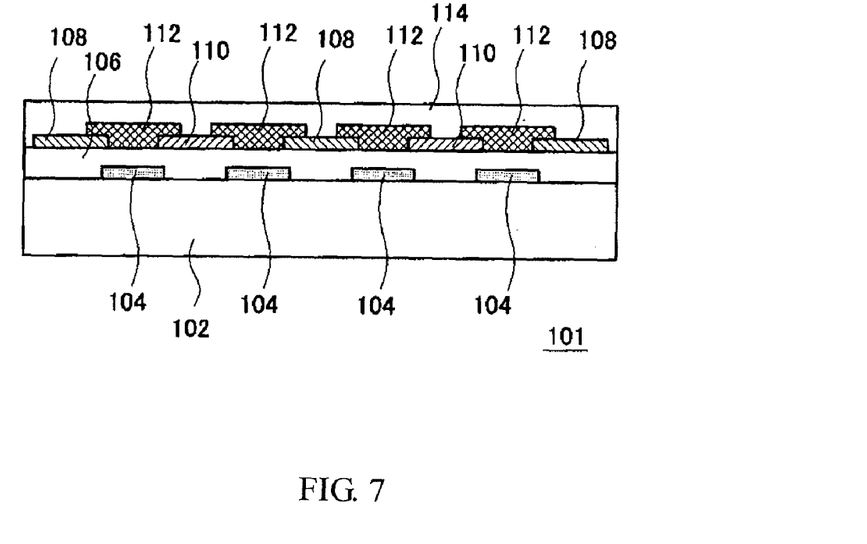
FIG. 7 is a cross-sectional view of the thin film transistor group 101 shown in FIG. 2 taken from the line A-A.

FIG. 7 is a cross-sectional view of the thin film transistor group 101 shown in FIG. 2 taken from the line A-A. The A-A cross-sectional view shows a portion of the drive transistor Trd, but a cross-sectional view of a portion of the switch transistor Trs would be the same. Each drive transistor Trd and switch transistor Trs of the thin film transistor group 101 includes a substrate 102, gate electrodes 104, a gate insulating film 106, drain electrodes 108, source electrodes 110, channel layers 112, and an insulating film 114.

The gate electrodes 104 are formed on the substrate 102. The gate insulating film 106 covers the gate electrodes 104, and the drain electrodes 108 and source electrodes 110 are formed on the gate insulating film 106. The channel layers 112 are formed between the drain electrodes 108 and the source electrodes 110 to create the channel regions. The channel layers 112 may be organic semiconductors. The insulating film 114 covers the entire transistor to protect the elements.

A region in which a gate electrode 104 of the drive transistors Trd is not formed is provided beneath the source electrodes 110 and drain electrodes 108 of the drive transistors Trd. A region in which a gate electrode 104 of the switch transistors Trs is not formed is provided beneath the source electrodes 110 and drain electrodes 108 of the switch transistors Trs. By providing this region in which the gate electrodes 104 are not formed, the stray capacitance is decreased to improve the response speed of the transistor.

Figure 8:
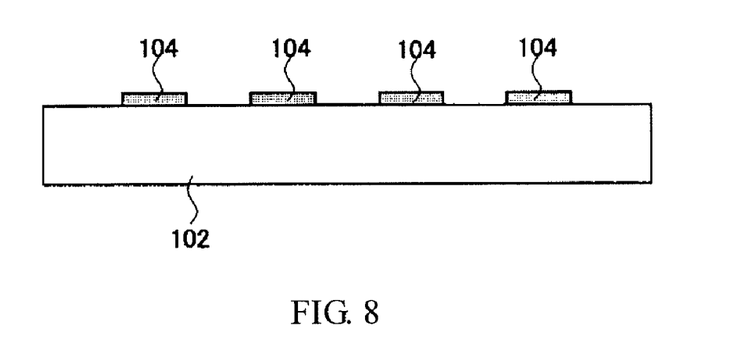
FIG. 8 is a cross-sectional view of a process for manufacturing the thin film transistor group 101.

FIGS. 8 to 11 are cross-sectional views of a process for manufacturing the thin film transistor group 101. As shown in FIG. 8, a substrate 102 is prepared and gate electrodes 104 are formed on the substrate 102. The material for the gate electrodes 104 is not particularly limited. Single element metals such as Cr, Ti, Al, Mo, Ta, Nb and the like are provided as examples, and other possible materials include a nitride, a 2-element alloy, or a 3-element alloy of any of these metals. Furthermore, metal particles or a conductive polymer that can be formed by coating can be used.

Figure 9:
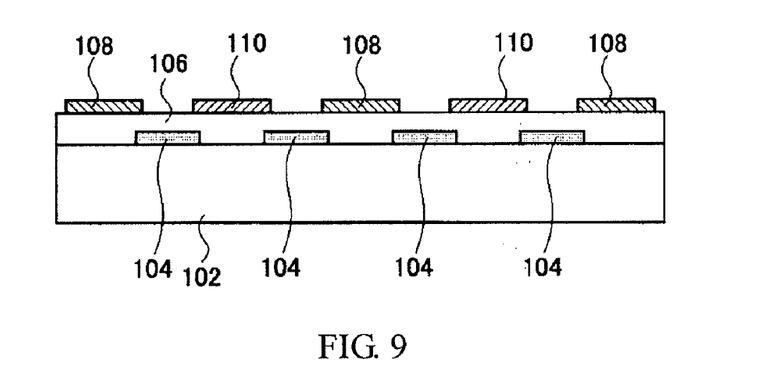
FIG. 9 is a cross-sectional view of a process for manufacturing the thin film transistor group 101.

As shown in FIG. 9, the gate insulating film 106 is formed and source electrodes 110 and drain electrodes 108 are then formed thereon. The material for the gate insulating film 106 may be an organic insulator such as a polyimide, polyvinylpyrrolidone, a siloxane polymer, or the like. Instead, this material may be an inorganic insulator such as silicon oxide, silicon nitride, alumina, or the like.

The material for the drain electrodes 108 and source electrodes 110 may be a metal such as Au, Ag, Al, Pt, Cu, Fe, Mo, Ni, W, Ir, Pd, or the like, or may be a metal oxide such as indium tin oxide (ITO), indium zinc oxide (IZO), or the like. As another example, a conductive polymer such as PEDOT- PSS may be used. When considering the efficiency of charge injection to the semiconductor layer, materials with high work functions such as Au, Pt, Ir, Pd, ITO, IZO, and PEDOT (polyethylenedioxythiophene)-PSS (polystyrenesulfonate) are preferable.

Figure 10:
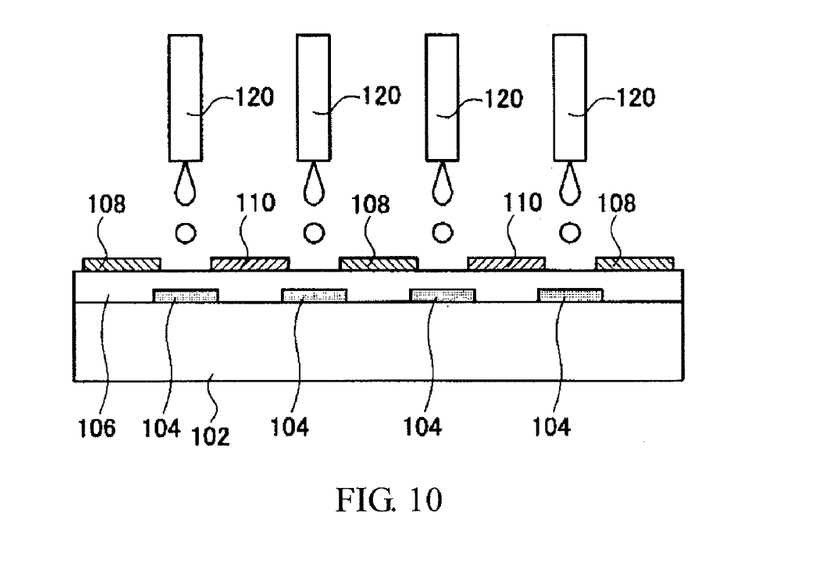
FIG. 10 is a cross-sectional view of a process for manufacturing the thin film transistor group 101.

As shown in FIG. 10, material ink for the channel layers 112 is discharged from nozzles 120 between the source electrodes 110 and the drain electrodes 108 according to a coating technique, such as nozzle coating or ink jet coating. With this method, the material ink can be easily supplied between the source electrodes 110 and the drain electrodes 108 aligned linearly in the direction of the channel width.

Figure 11:
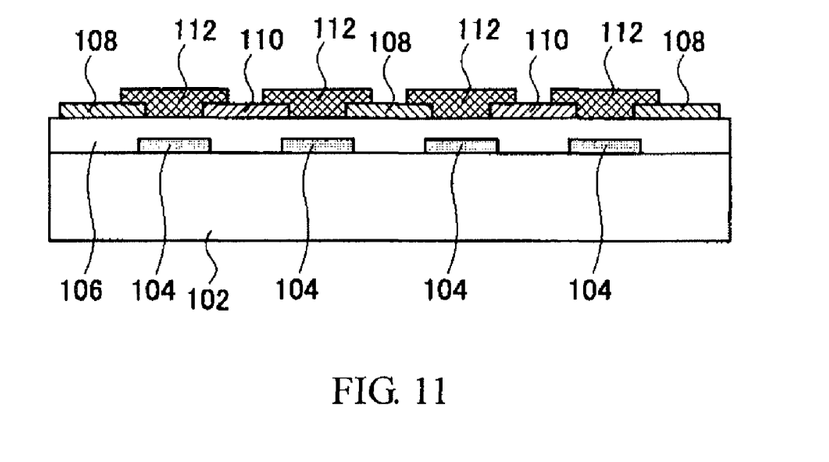
FIG. 11 is a cross-sectional view of a process for manufacturing the thin film transistor group 101.

As shown in FIG. 11, the channel layers 112 are formed using a baking process or the like. If organic material is used for the channel layers 112, this organic material may be a polythiophene semiconductor polymeric material such as poly(3-hexylthiophene) or a fluorene semiconductor polymeric material such as a 9,9-di-n-octyl fluoren-bithiophene copolymer. Other organic materials that may be used include semiconductor monomer materials such as anthracene, tetracene, pentacene, C60 fullerene, copper phthalocyanine, or the like. The thickness of the films described above is not particularly limited. Any thickness may be used as long as the desired characteristics, such as electrical characteristics and mechanical characteristics, are ensured for the films.

The thin film transistor group 101 according to the present embodiment can be manufactured in the manner described above. Since the channel regions of each transistor are aligned linearly in the direction of the channel width in the thin film transistor group 101, the channel layers 112 can be formed in a desirable shape using a coating technique that can selectively coat a coating region, such as ink jet coating. The thin film transistor group 151, which is another embodiment of the present invention, can be manufactured in the same manner as the thin film transistor group 101.

The thin film transistor group 101 of the present embodiment or the thin film transistor group 151 of the other embodiment can be used to realize a thin film transistor array. The thin film transistor array is an example of the thin film active element array. In other words, the thin film transistor array realized by the thin film transistor group 101 or the thin film transistor group 151 includes a plurality of thin film transistor groups in a matrix formation on a flat substrate. The channel regions of the drive transistor Trd and the channel regions of the switch transistor Trs included in each thin film transistor group are aligned linearly in a direction of the rows or the columns of the matrix formation.

The display apparatus using the thin film transistor group 151 or the thin film transistor group 101 according to embodiments of the present invention can be used to realize an organic light emitting device if the light emitting elements PL are organic light emitting elements. In other words, if the thin film transistor group 101 is used, the voltage or current from the drain electrodes 108 of the switch transistor Trs is supplied to the gate electrodes 104 of the drive transistor Trd, and a current from the drain electrodes 108 of the drive transistor Trd is supplied to the light emitting element. The current from the source line SL, which is an example of a power supply line, is supplied to the source electrodes 110 in each drive transistor Trd in the plurality of thin film transistor groups. The voltage or current from the data line is supplied to the source electrodes 110 in each switch transistor Trs in the plurality of thin film transistor groups. The voltage or current from the gate line GL is supplied to the gate electrodes 104 in each switch transistor Trs in the plurality of thin film transistor groups. By selecting a gate line GL and a data line DL, the light emitting elements in each thin film transistor group with a matrix formation can be driven.

If the thin film transistor group 151 is used, the voltage or current from the drain electrodes 108 of the switch transistor Trs is supplied to the memory element Mem and the gate electrodes 104 of the drive transistor Trd, and a current from the drain electrodes 108 of the drive transistor Trd is supplied to the light emitting element. The current from the source line SL, which is an example of a power supply line, is supplied to the source electrodes 110 in each drive transistor Trd in the plurality of thin film transistor groups. The voltage or current from the data line is supplied to the source electrodes 110 in each switch transistor Trs in the plurality of thin film transistor groups. The voltage or current from the gate line GL is supplied to the gate electrodes 104 in each switch transistor Trs in the plurality of thin film transistor groups. By selecting a gate line GL and a data line DL or according to the data stored in the memory element Mem, the light emitting elements in each thin film transistor group with a matrix formation can be driven.

Figure 12:
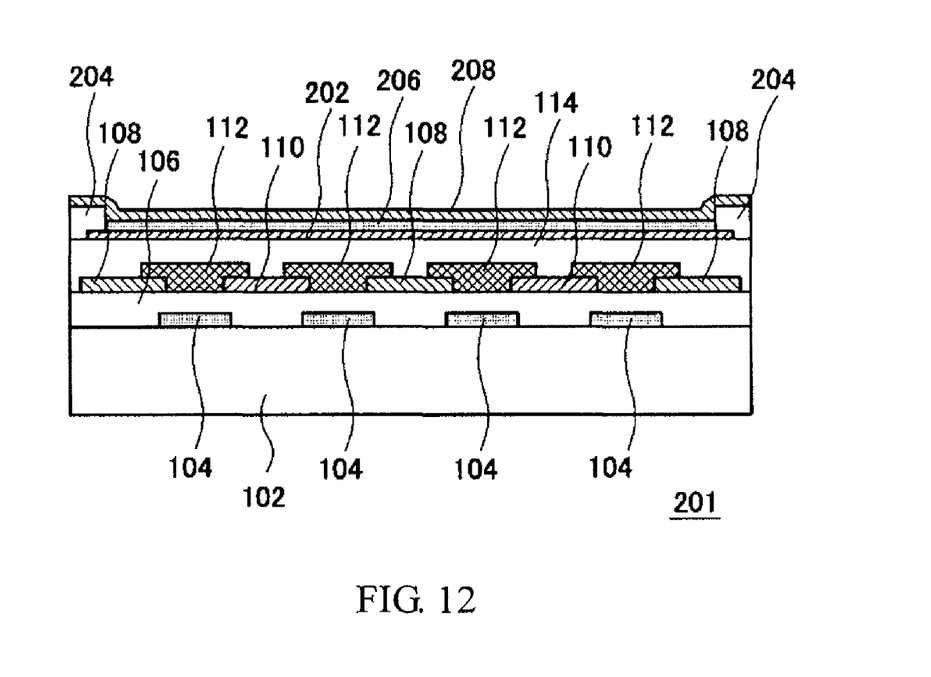
FIG. 12 is a cross-sectional view of an organic light emitting device 201 that uses the thin film transistor group 101 or the thin film transistor group 151.

FIG. 12 is a cross-sectional view of an organic light emitting device 201 that uses the thin film transistor group 101 or the thin film transistor group 151. The organic light emitting device 201 is provided with a drive transistor Trd in which semiconductor channel layers 112 are formed in channel regions between the source electrodes 110 and the drain electrodes 108. The organic light emitting device 201 is also provided with a switch transistor Trs in which semiconductor channel layers 112 are formed in channel regions between the source electrodes 110 and the drain electrodes 108. The switch transistor Trs of the thin film transistor group 101 switches the drive transistor Trd. The switch transistor Trs of the thin film transistor group 151 supplies data to the drive transistor Trd and the memory element Mem.

The channel regions of the switch transistor Trs and the channel regions of the drive transistor Trd in the organic light emitting device 201 are aligned linearly in the direction of the channel width, and light emitting elements that are selected or driven by the thin film transistor group are formed on the thin film transistor group. Each light emitting element includes a bottom electrode 202, banks 204 formed on a periphery of a light emitting region, a light emitting layer 206, and a top electrode 208. If the top electrode 208 is a transparent electrode, the organic light emitting device 201 becomes a top-emission type. If liquid crystal display elements are formed instead of the light emitting elements, the organic light emitting device 201 can serve as a display apparatus.

In the organic light emitting device described above, one light emitting element is provided for each thin film transistor group 101 or thin film transistor group 151. In other words, the organic light emitting device includes a plurality of thin film transistor groups and light emitting elements, and the plurality of transistor groups are arranged in a matrix on a flat substrate. The channel regions of the drive transistors Trd included in the thin film transistor group and the channel regions of the switch transistors Trs included in the thin film active element group are aligned linearly in the rows or columns of the matrix. The plurality of light emitting elements are arranged in each transistor group such that each thin film transistor group drives one light emitting element.

The following describes an exemplary configuration according to an embodiment of the present invention in which the light emitting elements are organic electroluminescent elements. The organic electroluminescent elements are referred to as "organic EL elements" hereinafter.

The organic EL elements of the present embodiment each include an anode, a light emitting layer, and a cathode, and also include another layer between the anode and the light emitting layer and/or between the light emitting layer and the cathode. The layer provided between the cathode and the light emitting layer may be an electron injection layer, an electron transport layer, a hole blocking layer, or the like. If both an electron injection layer and an electron transport layer are provided, the layer closer to the cathode is the electron injection layer and the layer closer to the light emitting layer is the electron transport layer.

The electron injection layer improves the efficiency of electron injection from the cathode. The electron transport layer improves the electron injection from the cathode, the electron injection layer, or an electron transport layer closer to the cathode. If the electron injection layer or the electron transport layer functions to dam transport of holes, these layers may function as the hole blocking layer. The function of damming the transport of holes can be confirmed by a decrease in the electron current value when elements that allow a hole current to flow but do not allow an electron current to flow are created.

The layer provided between the anode and the light emitting layer may be a hole injection layer, a hole transport layer, an electron blocking layer, or the like. If both a hole injection layer and a hole transport layer are provided, the layer closer to the anode is the hole injection layer and the layer closer to the light emitting layer is the hole transport layer.

The hole injection layer improves the efficiency of hole injection from the anode. The hole transport layer improves the hole injection from the anode, the hole injection layer, or a hole transport layer closer to the anode. If the hole injection layer or the hole transport layer functions to dam transport of electrons, these layers may function as the electron blocking layer. The function of damming the transport of the electrons can be confirmed by a decrease in the hole current value when elements that allow an electron current to flow but do not allow a hole current to flow are created.

The organic EL elements of the present embodiment are each provided with one light emitting layer, but may instead be provided with two or more light emitting layers. It should be noted that the electron injection layer and the hole injection layer may be referred to collectively as charge injection layers, and that the electron transport layer and the hole transport layer can be referred to collectively as charge transport layers. As more specific examples, the organic EL elements of the present embodiment may have any of the following layered structures.

a) anode/hole transport layer/light emitting layer/cathode
b) anode/light emitting layer/electron transport layer/cathode
c) anode/hole transport layer/light emitting layer/electron transport layer/cathode
d) anode/charge injection layer/light emitting layer/cathode
e) anode/light emitting layer/charge injection layer/cathode
f) anode/charge injection layer/light emitting layer/charge injection layer/cathode
g) anode/charge injection layer/hole transport layer/light emitting layer/cathode
h) anode/hole transport layer/light emitting layer/charge injection layer/cathode
i) anode/charge injection layer/hole transport layer/light emitting layer/charge injection layer/cathode
j) anode/charge injection layer/light emitting layer/charge transport layer/cathode
k) anode/light emitting layer/electron transport layer/charge injection layer/cathode
l) anode/charge injection layer/light emitting layer/electron transport layer/charge injection layer/cathode
m) anode/charge injection layer/hole transport layer/light emitting layer/charge transport layer/cathode
n) anode/hole transport layer/light emitting layer/electron transport layer/charge injection layer/cathode
o) anode/charge injection layer/hole transport layer/light emitting layer/electron transport layer/charge injection layer/cathode (Here, and hereinafter, the symbol "/" indicates a border between adjacent layers.)

The organic EL elements of the present embodiment may have more than two light emitting layers. A specific example of an organic EL element with two light emitting layers is shown below.

p) anode/charge injection layer/hole transport layer/light emitting layer/electron transport layer/charge injection layer/electrode/charge injection layer/hole transport layer/light emitting layer/electron transport layer/charge injection layer/cathode An organic EL element with three or more light emitting layers can be achieved by repeating the combined unit of "electrode/charge injection layer/hole transport layer/light emitting layer/electron transport layer/charge injection layer" two or more times, as shown in the example below.

q) anode/charge injection layer/hole transport layer/light emitting layer/electron transport layer/charge injection layer/combined unit/combined unit . . . /cathode In the p and q structures described above, any of the layers except for the anodes, electrodes, cathodes, and light emitting layers may be removed. Here, the electrodes generate holes and electrons by applying an electric field. The electrodes may be vanadium oxide, indium tin oxide, molybdenum oxide, or the like.

The organic EL elements of the present embodiment may also each include a substrate, and each layer may be formed on this substrate. The organic EL elements of the present embodiment may also each include a sealing component that sandwiches the layers with the substrate. An organic EL element having the substrate and layered structure has the substrate on the anode side, but in the present embodiment the substrate may be on either the anode side or the cathode side.

In order to emit light from the light emitting layers, all of the layers in the organic EL elements of the present invention that are on one side of a light emitting layer are formed to be transparent. More specifically, for an organic EL element having a structure of "substrate/anode/charge injection layer/hole transport layer/light emitting layer/electron transport layer/charge injection layer/cathode/sealing component," a so-called bottom-emission type element can be formed by making the substrate, anode, charge injection layer, and hole transport layer all transparent. Instead, a so-called top-emission type element can be formed by making the electron transport layer, charge injection layer, cathode, and sealing component all transparent.

For an organic EL element having a structure of "substrate/cathode/charge injection layer/electron transport layer/light emitting layer/hole transport layer/charge injection layer/anode/sealing component," a so-called bottom-emission type element can be formed by making the substrate, cathode, charge injection layer, and electron transport layer, all transparent. Instead, a so-called top-emission type element can be formed by making the hole transport layer, charge injection layer, anode, and sealing component all transparent. Here, "transparent" means that the visual light transmission rate from the light emitting layer to the layer from which the light is emitted is preferably no less than 40%. If light in the ultraviolet or infrared regions is to be output by the elements, the transmission rates for these regions are preferably no less than 40%.

In order to improve the adhesion to the electrodes or the charge injection from the electrodes, the organic EL elements of the present invention may each be provided with an insulating layer no greater than 2 nm thick or the charge injection layer at a position adjacent to the electrode. In order to improve the interface adhesion or prevent mixing, the organic EL elements of the present invention may each include a thin buffer layer inserted at the interfaces of the light emitting layer or the charge transport layer. The order in which these layers are layered, the number of layers, and the thickness of the layers may be changed as needed according to the desired light emission efficiency or lifetime.

The following provides a specific example of the material and formation method for each layer in an organic EL element according to the present embodiment. The substrate of the organic EL element of the present embodiment may be any substance that does not change when the electrodes and organic layers are formed thereon, such as glass, plastic, polymer film, silicon, or a layered structure containing a plurality of these materials. The substrate may be a commercially available product or may be manufactured using a known method.

The anode of the organic EL element of the present embodiment is preferably a transparent or translucent electrode, as this allows the resulting element to emit light through the anode. This transparent or translucent electrode may be a thin film made of a metal oxide, a metal sulfide, or a metal having high electric conductivity. This electrode is preferably a material with high transmittance and can be selected depending on the organic layer to be used. More specifically, this electrode may be gold, platinum, silver, copper, or a film (NESA or the like) formed using a conductive glass including indium oxide, zinc oxide, tin oxide, or a compound of these materials such as indium tin oxide (ITO) or indium zinc oxide. The electrode is preferably made of ITO, indium zinc oxide, or tin oxide. The manufacturing method may be vacuum deposition, sputtering, ion plating, cladding, or the like. The anode may be an organic transparent conductive film such as polyaniline or a derivative thereof, polythiophene or a derivative thereof, or the like.

The anode may be a material that reflects light, and such a material is preferably a metal, metal oxide, or metal sulfide with a work function no less than 3.0 eV. The thickness of the anode can be set as desired while considering the optical transmittance and electric conductivity, and a thickness from 10 nm to 10 µm is acceptable, but the thickness is preferably from 20 nm to 1 µm and more preferably from 50 nm to 500 nm.

The hole injection layer can be provided between the anode and the hole transport layer or between the anode and the light emitting layer. In the organic ELT of the present embodiment, the material for forming the hole injection layer may be amorphous carbon, polyaniline, polythiophene derivatives, phenylamine, starburst amine, phthalocyanine, or an oxide such as vanadium oxide, molybdenum oxide, titanium oxide, or aluminum oxide.

The material for the hole transport layer may be polyvinyl carbazole or a derivative thereof, polysilane or a derivative thereof, a polysiloxane derivative including aromatic amine in a main or side chain, a pyrazoline derivative, an arylamine derivative, a stilbene derivative, or a triphenyldiamine derivative. Other exemplary materials include polyaniline or a derivative thereof, polythiophene or a derivative thereof, polyarylamine or a derivative thereof, polypyrrole or a derivative thereof, poly (p-phenylenevinylene) or a derivative thereof, and poly (2,5-thienylene vinylene) or a derivative thereof.

From among these materials, those that are preferable for use in the hole transport layer are polyvinyl carbazole or a derivative thereof, polysilane or a derivative thereof, a polysiloxane derivative including aromatic amine in a main or side chain, polyaniline or a derivative thereof, and polythiophene or a derivative thereof. In addition, preferable polymer hole transport material includes polyarylamine or a derivative thereof, poly (p-phenylenevinylene) or a derivative thereof, and poly (2,5-thienylene vinylene) or a derivative thereof. Materials that are more preferable include polyvinyl carbazole or a derivative thereof, polysilane or a derivative thereof, and a polysiloxane derivative including aromatic amine in a main or side chain. When a monomer hole transport material is used, this material is preferably dispersed in a polymer binder.

The method for forming the hole transport layer is not particularly limited, but one example is forming the hole transport layer from a mixture of a monomer hole transport material and a polymer binder. Another method is forming the film from a solution with a polymer hole transport material. The solvent used when forming the film from a solution is not particularly limited, as long as the hole transport material can be dissolved in the solvent. Exemplary solvents include chlorine solvents such as chloroform, methylene chloride, and dichloroethane; ether solvents such as tetrahydrofuran; aromatic hydrocarbons such as toluene and xylene; ketone solvents such as acetone and methl ethyl ketone; and ester solvents such as ethyl acetate, butyl acetate, and ethyl cellosolve acetate.

Forming the film from a solution may involve spin coating, casting, microgravure coating, gravure coating, bar coating, roll coating, wire bar coating, and dip coating. Other coating methods that can be used include spray coating, screen printing, flexographic printing, offset printing, and ink jet printing.

The polymer binder in the mixture desirably does not significantly interfere with the charge transport and does not have significant absorption of visible light. Examples of such a polymer binder include polycarbonate, polyacrylate, polymethyl acrylate, polymethyl methacrylate, polystyrene, polyvinyl chloride, and polysiloxane.

The ideal thickness of the hole transport layer changes depending on the material used, and should be selected to achieve the most preferable values for drive voltage and light emission efficiency. The minimum requirement is a thickness large enough to prevent pin holes from occurring. If the layer is too thick, the drive voltage of the element undesirably increases, and this determines the maximum thickness of the layer. Accordingly, the thickness of the hole transport layer is typically from 1 nm to 1 µm, and is preferably 2 nm to 500 nm and more preferably 5 nm to 200 nm.

Each light emitting layer is preferably an organic light emitting layer in the present embodiment, and includes an organic material that emits mostly fluorescent or phosphorescent light (monomer compounds and polymer compounds) and a dopant that supplements this organic material. Materials that can be used to form the light emitting layers of the present embodiment are described below.

Examples of colorants include a cyclopentamine derivative compound, a tetraphenyl butadiene derivative, a triphenylamine derivative, an oxadiazole derivative, a pyrazoloquinoline derivative, and a distyrylbenzene derivative. Other examples include a distyrylarylene derivative, a pyrrole derivative, a thiophene ring compound, a pyridine ring compound, a perinone derivative, a perylene derivative, an oligothiophene derivative, a trifumanylamine derivative, an oxadiazole dimer, and a pyrazoline dimer.

Examples of metal complex materials include materials in which the center metal is Al, Zn, Be or the like, or a rare earth metal such as Tb, Eu, or Dy while the ligand is oxadiazole, thiadiazole, phenylpyridine, phenylbenzoimidazole, quinoline or other structures. For example, this metal complex material may be a metal complex having light emission from a triplet excited state, such as an iridium complex or a platinum complex, or may be an alumiquinolinol complex, a benzoquinolinol beryllium complex, a benzoxazolyl zinc complex, a benzothiazole zinc complex, an azomethyl zinc complex, a porphyrin zinc complex, or a europium complex.

Examples of polymeric materials include a polyparaphenylenevinylene derivative, a polythiophene derivative, a polyparaphenylene derivative, and a polysilane derivative. Other examples include a polyacetylene derivative, a polyfluorene derivative, a polyvinylcarbazole derivative, and polymers obtained by polymerizing the colorants or metal complex materials described above.

Examples of blue light emitting materials from among the above light emitting materials include a distyrylarylene derivative, an oxadiazole derivative, and polymers thereof. Further examples include a polyvinylcarbazole derivative, a polyparaphenylene derivative, and a polyfluorene derivative. From among these materials, a polyvinylcarbazole derivative, a polyparaphenylene derivative, and a polyfluorene derivative are preferable.

Examples of green light emitting materials include a quinacridone derivative, a coumarin derivative, and polymers thereof. Further examples include a polyparaphenylenevinylene derivative and a polyfluorene derivative. From among these materials, a polyparaphenylenevinylene derivative and a polyfluorene derivative are preferable.

Examples of red light emitting materials include a coumarin derivative, a thiophene ring compound, and polymers thereof. Further examples include a polyparaphenylenevinylene derivative, a polythiophene derivative, and a polyfluorene derivative. From among these materials, a polyparaphenylenevinylene derivative, a polythiophene derivative, and a polyfluorene derivative are preferable.

A dopant may be added to the light emitting layer to improve the light emission efficiency or to change the light emission wavelength. Examples of possible dopants include a perylene derivative, a coumarin derivative, a rubrene derivative, a quinacridone derivative, a squalium derivative, a porphyrin derivative, a styryl dye, a tetracene derivative, a pyrazolone derivative, decacyclene, and phenoxazone. The thickness of this light emitting layer can be from 2 nm to 200 nm.

The method for forming the light emitting layers containing the organic compound may be a vacuum deposition method, a transfer method, or a coating method for applying a solution including the light emitting material to the top of the substrate. Specific examples of the solvents used when forming the film from a solution are the same as the solvents used for dissolving the hole transport material when forming the hole transport layer from a solution, as described above.

The method for applying the solution including the light emitting material to the top of the substrate may be a coating method. This coating method may be spin coating, casting, microgravure coating, gravure coating, bar coating, roll coating, wire bar coating, deep coating, slit coating, capillary coating, spray coating, or nozzle coating. Other possible methods include gravure printing, screen printing, flexographic printing, offset printing, inverse printing, and ink jet printing.

Preferable methods include gravure printing, screen printing, flexographic printing, offset printing, inverse printing, and ink jet printing, since pattern formation and multi-color separation are easily achieved with these methods. In the case of a sublimable monomer compound, vacuum deposition can be used. Furthermore, the light emitting layer can be formed on a prescribed region by thermal transferring or laser transferring.

The electron transport layer may be a widely known electron transport layer, and may be made of an oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, or a fluorenone derivative. Other examples include diphenyldicyanoethylene or a derivative thereof, diphenoquinone or a derivative thereof, 8-hydroxyquinoline or a metal complex of a derivative thereof, polyquinoline or a derivative thereof, polyquinoxaline or a derivative thereof, and polyfluorene or a derivative thereof.

From among these materials, an oxadiazole derivative, benzoquinone or a derivative thereof, anthraquinone or a derivative thereof, 8-hydroxyquinoline or a metal complex of a derivative thereof, polyquinoline or a derivative thereof, polyquinoxaline or a derivative thereof, and polyfluorene or a derivative thereof are preferable. Even more preferable are 2-(4-biphenylyl)-5-(4-t-butylphenyl)-1,3,4-oxadiazole, benzoquinone, anthraquinone, tris-(8-quinolinol) aluminum, and polyquinoline.

The formation method for the electron transport layer is not particularly limited. The formation method involving a monomer electron transport layer may be vacuum deposition from a powder or formation from a solution or a melt. The formation method involving a polymer electron transport layer may be formation from a solution or a melt. During formation from a solution or a melt, a polymer binder may also be used. The method for forming the electron transport layer from a solution may be the same as the method used for forming the hole transport layer from a solution, as described above.

The ideal thickness of the electron transport layer changes depending on the material used, and should be selected to achieve the most preferable values for drive voltage and light emission efficiency. The minimum requirement is a thickness large enough to prevent pin holes from occurring. If the layer is too thick, the drive voltage of the element undesirably increases, and this determines the maximum thickness of the layer. Accordingly, the thickness of the hole transport layer is typically from 1 nm to 1 μm, and is preferably 2 nm to 500 nm and more preferably 5 nm to 200 nm.

The electron injection layer can be provided between the cathode and the electron transport layer or between the cathode and the light emitting layer. Depending on the type of light emitting layer, the electron injection layer may be made of an alkali metal, an alkali earth metal, an alloy including one or more of these types of metals, a metal oxide containing one of these metals, a halide and a carbonate, or a mixture of the above materials. Examples of alkali metals and oxides, halides, and carbonates thereof include lithium, sodium, potassium, rubidium, cesium, lithium oxide, and lithium fluoride. Other examples include sodium oxide, sodium fluoride, potassium oxide, potassium fluoride, rubidium oxide, rubidium fluoride, cesium oxide, cesium fluoride, and lithium carbonate.

Examples of alkali earth metals and oxides, halides, and carbonates thereof include magnesium, calcium, barium, strontium, magnesium oxide, magnesium fluoride, calcium oxide, and calcium fluoride. Other examples include barium oxide, barium fluoride, strontium oxide, strontium fluoride, and magnesium carbonate.

The electron injection layer may include two or more layers. Examples of this include LiF/Ca or the like. The electron injection layer may be formed using vapor deposition, sputtering, printing, or the like. The thickness of the electron injection layer is desirably from 1 nm to 1 µm.

The material for the cathode used in the organic EL element of the present embodiment is preferably a material that has a low work function for easy electron injection to the light emitting layer, has high electric conductivity, and has a high transmittance of visible light. Suitable metals include alkali metals, alkali earth metals, transitional metals, and III-B metals. Examples of such metals include lithium, sodium, potassium, rubidium, cesium, beryllium, magnesium, calcium, strontium, barium, aluminum, and scandium. Other examples include vanadium, zinc, yttrium, indium, cerium, samarium, europium, terbium, and ytterbium. In addition to any one of these metals, an alloy of two or more of these metals; an alloy including one or more of these metals and one or more of gold, silver, platinum, copper, manganese, titanium, cobalt, nickel, tungsten, and tin; or graphite or a graphite intercalation compound may be used.

Exemplary alloys include a magnesium-silver alloy, a magnesium-indium alloy, a magnesium-aluminum alloy, an indium-silver alloy, a lithium-aluminum alloy, lithium-magnesium alloy, a lithium-indium alloy, and a calcium-aluminum alloy. Furthermore, a transparent conductive electrode can be used as the cathode, and this electrode may be made of a conductive metal oxide or a conductive organic compound. Specific examples of conductive metal oxides include indium oxide, zinc oxide, tin oxide, and compounds of these oxides, such as indium tin oxide (ITO) and indium zinc oxide (IZO). Examples of conductive organic compounds include polyaniline or a derivative thereof and polythiophene or a derivative thereof. The cathode may include two or more layers. The ion injection layer may sometimes be used as the cathode.

The thickness of the cathode can be selected while considering electrical conduction and endurance, is typically from 10 nm to 10 µm, and is preferably from 20 nm to 1 µm and more preferably from 50 nm to 500 nm. The method for forming the cathode may be vacuum vapor deposition, sputtering, lamination for thermally depositing a metallic thin film, or the like.

An insulting layer no greater that 2 nm thick, which can be included in the organic EL element of the present embodiment as desired, facilitates the electron injection. The material for this insulating layer may be a metal nitride, a metal oxide, an organic insulating material, or the like. The organic EL element provided with the insulating layer with a thickness no greater than 2 nm may have this insulating layer provided adjacent to the anode or adjacent to the cathode.

The organic EL element of the present embodiment can be used as a backlight in a flat light source, a segment display apparatus, a dot matrix display apparatus, or a liquid crystal display apparatus. In order to use the organic EL element of the present embodiment in a flat light source, the organic EL element should be arranged such that the flat cathode and anode overlap.

Furthermore, in order to realize a patterned light source, techniques such as placing a mask provided with a pattern window on the surface of the flat light emitting element, forming the organic layers of portions that do not emit light to be thicker to substantially prevent light emission, and forming the electrodes of one or both of the anode and the cathode according to pattern conditions may be used. By forming a pattern using one of these methods and arranging several electrodes to be turned ON or OFF independently, a segment-type display element can be obtained that can display numbers, characters, and simple symbols.

In order to obtain a dot matrix element, the anodes should be formed orthogonal to the cathodes in a striped arrangement. A partial color display or a multi-color display can be achieved by applying a color separation technique to light emitting materials emitting different types of light or by using a fluorescent light filter or color filter. The dot matrix element can perform passive drive, and can perform active drive when combined with a TFT or the like. These display elements may be used as display apparatuses in computers, televisions, cellular terminals, cellular phones, car navigation systems, video camera view finders, or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

INDUSTRIAL APPLICABILITY

The thin film active element group, the thin film active element array, the organic light emitting device, the display apparatus, and the thin film active element group manufacturing method of the present invention can be used in apparatuses that employ display apparatuses, illumination apparatuses, or other types of light emitting elements.

The invention claimed is:

1. A thin film active element group comprising:
   a plurality of drive active elements, each element having a semiconductor channel layer formed in a channel region between a source electrode and a drain electrode; and
   a plurality of switch active elements, each having a semiconductor channel layer formed in a channel region between a source electrode and a drain electrode, the switch active elements switching the drive active elements,
   wherein each of the switch active elements is formed to be separated from a corresponding drive active element such that the channel region of the drive active element and the channel region of the switch active element are aligned linearly with each other in a direction of channel widths;
   wherein the source electrodes of the drive active elements are connected with each other and the drain electrodes of the drive active elements are connected with each other; and
   wherein the source electrodes of the switch active elements are connected with each other and the drain electrodes of the switch active elements are connected with each other.

2. The thin film active element group according to claim 1, wherein
   a channel length of each of the switch active elements is equal to a channel length of the corresponding drive active element.

3. The thin film active element group according to claim 1, wherein
   a region that contains a gate electrode and a region that does not contain a gate electrode are formed below each source electrode and drain electrode in each of the drive active elements, and a region that contains a gate electrode and a region that does not contain a gate electrode are formed below each source electrode and drain electrode in each of the switch active elements.

4. The thin film active element group according to claim 1, further comprising a memory element that stores data acquired through the switch active elements and drives the drive active elements according to the stored data after supply of a current by the switch active elements is stopped.

5. The thin film active element group according to claim 1, wherein
the channel layers of the drive active elements and the switch active elements are made of an organic material.

6. The thin film active element group according to claim 5, wherein
the channel layers of the drive active elements and the switch active elements are formed using a coating technique.

7. A thin film active element array comprising a plurality of the thin film active element groups according to claim 1, wherein
the thin film active element groups are arranged in a matrix on a flat substrate, and
the channel regions of the drive active elements in the thin film active element groups and the channel regions of the switch active elements in the thin film active element groups are aligned linearly in a direction of rows or columns of the matrix.

* * * * *